United States Patent [19]

Komino

[11] Patent Number: 5,769,952
[45] Date of Patent: Jun. 23, 1998

[54] REDUCED PRESSURE AND NORMAL PRESSURE TREATMENT APPARATUS

[75] Inventor: Mitsuaki Komino, Nakano-ku, Japan

[73] Assignee: Tokyo Electron, Ltd., Tokyo-TO, Japan

[21] Appl. No.: 842,833

[22] Filed: Apr. 17, 1997

Related U.S. Application Data

[62] Division of Ser. No. 458,806, Jun. 2, 1995, abandoned.

[30] Foreign Application Priority Data

Jun. 7, 1994 [JP] Japan ................................. 6-148485
Aug. 19, 1994 [JP] Japan ................................. 6-217810

[51] Int. Cl.⁶ ............................................. C23C 16/00
[52] U.S. Cl. ........................... 118/733; 118/719; 251/193; 137/315; 156/345
[58] Field of Search ................................. 118/733, 728, 118/723 E, 719; 156/345; 251/62, 87, 193, 63.5, 326, 329, 301, 366; 137/315

[56] References Cited

U.S. PATENT DOCUMENTS

| | | | |
|---|---|---|---|
| 4,376,692 | 3/1983 | Tsukada et al. | 156/345 |
| 4,472,455 | 9/1984 | Dean et al. | 204/298.15 |
| 4,535,834 | 8/1985 | Turner | 165/80 R |
| 4,747,577 | 5/1988 | Dimock | 251/193 |
| 4,785,962 | 11/1988 | Toshima | 220/260 |
| 4,817,558 | 4/1989 | Itoh | 118/725 |
| 4,825,808 | 5/1989 | Takahashi | 118/719 |
| 4,917,556 | 4/1990 | Stark | 414/217 |
| 4,951,601 | 8/1990 | Maydan | 118/719 |
| 4,978,412 | 12/1990 | Aoki et al. | 156/345 |
| 5,002,255 | 3/1991 | Sawa et al. | 251/193 |
| 5,024,570 | 6/1991 | Kiriseko | 414/222 |
| 5,076,205 | 12/1991 | Vowles et al. | 118/719 |
| 5,135,608 | 8/1992 | Okutani | 156/643 |
| 5,135,629 | 8/1992 | Sawada et al. | 204/192.12 |
| 5,150,882 | 9/1992 | Kaneko | 251/193 |
| 5,186,718 | 2/1993 | Tepman et al. | 29/25.01 |
| 5,226,632 | 7/1993 | Tepman et al. | 251/335.3 |
| 5,259,881 | 11/1993 | Edwards | 118/719 |
| 5,286,296 | 2/1994 | Sato | 118/719 |
| 5,310,410 | 5/1994 | Begin | 118/719 |

(List continued on next page.)

FOREIGN PATENT DOCUMENTS

| | | | |
|---|---|---|---|
| 61-256639 | 11/1986 | Japan | 118/723 E |
| 61-263212 | 11/1986 | Japan | 118/728 |
| 62-54929 | 3/1987 | Japan | 118/728 |
| 62-98613 | 5/1987 | Japan | 118/728 |
| 62-263967 | 11/1987 | Japan | 118/728 |
| 63-187619 | 8/1988 | Japan | 118/723 E |
| 63-241161 | 10/1988 | Japan | 118/728 |
| 4-56127 | 2/1992 | Japan | 118/733 |
| 4-162709 | 6/1992 | Japan | 414/939 |
| 4-240721 | 8/1992 | Japan | 414/937 |

*Primary Examiner*—R. Bruce Breneman
*Assistant Examiner*—Jeffrie R. Lund
*Attorney, Agent, or Firm*—Beveridge, DeGrandi, Weilacher & Young, L.L.P.

[57] ABSTRACT

A reduced pressure treatment unit comprising a plurality of treatment chambers conducting reduced pressure process treatment of a treatment object (wafer) and a normal pressure treatment unit conducting normal pressure process treatment of the treatment object, which are connected by a load lock chamber. The reduced pressure treatment unit comprises a plurality of reduced pressure process treatment chambers connected by means of a gate valve to a reduced pressure transport chamber equipped with a robot arm. The normal pressure treatment unit comprises a plurality of normal pressure process treatment chambers disposed in the vicinity of a robot arm. The load lock chamber is disposed at a position where the transport ranges of the two robot arms overlap. Also, the gate valve opening and closing the transport opening between the load lock and treatment chambers comprises a surface layer portion exposed to the atmosphere within the treatment chamber and a rear base portion whereby the surface layer portion is freely attached and removed with respect to the base portion by, e.g., screws, thus enabling independent replacement of the surface layer portion.

5 Claims, 12 Drawing Sheets

U.S. PATENT DOCUMENTS

| | | | |
|---|---|---|---|
| 5,332,442 | 7/1994 | Kubodera et al. | 118/725 |
| 5,376,212 | 12/1994 | Saiki | 156/345 |
| 5,379,984 | 1/1995 | Coad et al. | 251/298 |
| 5,449,410 | 9/1995 | Chang et al. | 118/723 E |
| 5,456,757 | 10/1995 | Aruga et al. | 118/723 E |
| 5,474,410 | 12/1995 | Ozawa | 414/217 |
| 5,494,523 | 2/1996 | Steger et al. | 118/723 E |
| 5,501,739 | 3/1996 | Yamada et al. | 118/719 |
| 5,525,160 | 6/1996 | Tanaka et al. | 118/728 |
| 5,579,718 | 12/1996 | Freerks | 118/733 |

REDUCED PRESSURE AND NORMAL PRESSURE TREATMENT APPARATUS

This application is a division of application No. Ser. No. 08/458,806, filed Jun. 2, 1995, now abandoned which application is entirely incorporated herein by reference.

BACKGROUND OF THE INVENTION

The present invention relates to a reduced pressure and normal pressure treatment apparatus.

Cluster tool and multi-chamber are terms for previously known systems for treating objects such as semiconductor wafers under reduced pressure. When continuously performing the same or a plurality of reduced pressure treatment types, the transport of treatment objects between treatment chambers is performed under reduced pressure, and there are cases wherein contact with the atmosphere is prohibited until the completion of a plurality of treatments.

In the case of prior art reduced pressure treatment systems, treatment objects (also referred to in the following as semiconductor wafers and wafers) are removed one at a time from a wafer cassette containing a plurality semiconductor wafers into a load lock chamber that adjusts its ambient atmosphere from normal air to a vacuum prior to treatment. After treatment, the semiconductor wafers are returned to a wafer cassette.

As generally known, semiconductor manufacturing requires a number of processes, including other treatment processes before and after the above mentioned reduced pressure treatment.

Consequently, the semiconductor wafers in the cassette set in the above mentioned reduced pressure treatment apparatus may have undergone prior treatment in another apparatus. Also, semiconductor wafers returned to the cassette after completing the above mentioned reduced pressure treatment may be awaiting a subsequent process.

In many cases, treatment before and after the reduced pressure treatment needs to be conducted under normal atmospheric pressure. An example that can be mentioned in the case of semiconductor wafers is a cleaning and drying process prior to treatment under a reduced pressure atmosphere in order to remove impurities adhering to the surface as a result of previous processing.

Ordinarily, this type of cleaning and drying process is conducted as a batch process whereby a plurality of wafers per cassette is simultaneously processed in a cleaning and drying apparatus. The cleaned and dried wafers are then handled in units of per cassette and conveyed from the cleaning and drying apparatus to the reduced pressure treatment apparatus.

In the above manner, between the cleaning and drying apparatus for pre-processing and the reduced pressure treatment apparatus for post-processing, the treatment stages are separated in terms of both time and space. As a result, time intervals are required between the prior and subsequent processes for such functions as transport and equipment standby, and despite the effort expended for cleaning and drying, impurities are inevitably deposited on the surface of the treatment object being held in the standby atmosphere after treatment. In other words, in the conventional system, reduced pressure treatment in the next stage could not be started while maintaining the state directly after normal pressure treatment.

According to the type of normal pressure treatment, there are also cases of treating one semiconductor wafer at a time.

As progress continues in detailed processing, expanded use of this type of normal pressure treatment can be expected. In this case, -the handling frequency needed for inserting and removing the wafers from the cassette increases. The problems arising as the wafer handling frequency increases amid the overall processing time for manufacturing a series of semiconductors include not only reduced throughput and wasted drive energy, but also dust raised by mechanical contact with the wafers and decreasing 3yield rate.

Among wafer manufacturing processes, various types of vacuum treatment are performed such as etching and CVD. A vacuum treatment apparatus is normally constructed to comprise a load lock chamber serving as a preparatory vacuum chamber connected to a gas-tight treatment chamber (vacuum chamber) in order to prevent impurities contained in the atmosphere from entering within the treatment chamber. In addition, a valve structure termed a gate valve is disposed in the wafer transport opening between the load lock chamber atmosphere side and treatment chamber side for opening and closing the transport opening.

Following is a description in regard to a conventional gate valve with reference to FIG. 13.

In the figure, 301A is a gas-tight treatment chamber for conducting a vacuum treatment, such as plasma etching, with respect to a wafer. A gate valve 310 is disposed, for example, at the side of a load lock chamber 301B. The gate valve 310 is formed, for example, of aluminum in a squared column shape. An O-ring 310a is installed on the face of the treatment chamber 301A side of a valve structure 311 so as to tightly adhere to the circumference edge of a wafer transport opening 312 between the treatment chamber 301A and load lock chamber 301B. The gate valve 310 is coupled to an elevator shaft 314 by means of a link mechanism 313 (for example, a toggle mechanism). The elevator shaft 314 is raised and lowered by an air cylinder 350. When the upper surface of the valve structure 310 contacts a roller 315 of the load lock chamber 301B, the valve structure 310 is pressed in the forward direction by the link mechanism 313 to close the transport opening with a gas-tight seal.

However, cases occur when metal surfaces are damaged as a result of performing vacuum treatment. For example, in regard to plasma etching, there are occasions of using $Cl_2$ (chlorine gas) when etching $SiO_2$ (silicon dioxide) film. However, chlorine ions are very strongly corrosive, while plasma easily concentrates on the surface of the gate valve 310. Thus, in the case of this type of plasma etching, the corrosiveness of the chlorine ions is added to the shock of the plasma, resulting in severe damage to the gate valve 310. For this reason, the gate valve 310 is frequently replaced, for example, once per month. The replacement work was performed by removing the entire gate valve 310 from the link mechanism 313 and installing a new gate valve 310. Since the gate valve 310 is also corroded in processes other than plasma etching, such as when performing CVD with a strongly corrosive gas, the gate valve 310 was frequently replaced, Also, regardless of corrosivity, maintenance was performed at frequent intervals for cleaning reaction byproducts.

In practice, the installation of the gate valve, link mechanism and elevator shaft involves a large number of small parts, such as screws, brackets, shafts, washers, springs and others. Since the disassembly and reassembly work must be performed manually in the narrow space of the load lock chamber, the replacement work is both painstaking and time consuming.

Each apparatus used in the semiconductor manufacturing process is extremely costly. Therefore, importance is placed on imparting functions for obtaining the maximum throughput and ensuring high working rate for each unit of apparatus. Consequently, from the viewpoint of the overall manufacturing process, as the apparatus downtime for maintenance increases, the throughput declines. This type of problem also occurs in the case of components other than the gate valve requiring maintenance, for example, treatment gas emission means such as shower heads and clamp means for holding wafers on loading tables are damaged by plasma and contaminated by reaction byproducts.

SUMMARY OF THE INVENTION

An object of the present invention is to provide a reduced pressure and normal pressure treatment apparatus enabling improved treatment quality and throughput when performing normal pressure treatment as a prior or subsequent process to reduced pressure treatment by shortening the time interval between the reduced pressure and normal pressure processes, thereby allowing normal pressure treatment to be performed immediately before or after reduced pressure processing.

The reduced pressure and normal pressure treatment apparatus according to this invention comprises:

a plurality of reduced pressure process treatment chambers for reduced pressure treatment of treatment objects, a first gate device connecting the plurality of reduced pressure process treatment chambers, a reduced pressure transport chamber for transporting the treatment objects under reduced pressure, a load lock chamber disposed in the reduced pressure transport chamber having a second gate device connected to the reduced pressure transport chamber, and a third gate device communicating with the external atmosphere, a first transport means transporting treatment objects into and out of the reduced pressure process treatment chamber and load lock chamber, a container containing a plurality of treatment objects under higher than normal pressure, a normal pressure process treatment means treating the treatment objects before transporting the treatment objects into or after transporting the treatment objects out of the load lock chamber under higher than normal pressure, and a second transport means transporting the treatment objects into and out of the container, load lock chamber and normal pressure process treatment means under higher than normal pressure.

In the case of the reduced pressure and normal pressure treatment apparatus according to this invention, the treatment objects are directly transported into and out of the reduced pressure process treatment means via the load lock chamber. As a result, the interval between the reduced pressure process and the prior or subsequent normal pressure process is greatly shortened. Also, since normal pressure processing can be conducted at the time of handling when transporting into and out of a container such as a cassette, the handling frequency is reduced in comparison to conventional systems.

The present invention stems from these type of conditions and an objective is to provide a treatment apparatus that allows improving the work rate.

A feature of this invention in regard to an apparatus for treating treatment objects by treatment gas or plasma thereof within a gas-tight treatment chamber wherein the surface is exposed to the atmosphere in the treatment chamber. There is a laminar construction between the surface layer portion of the surface exposed to the atmosphere in the treatment chamber and the substrate portion of rear surface side, by which the surface layer portion can be freely attached and removed with respect to the substrate portion.

When the surfaces of the gate valve and other components are damaged or contaminated by reaction byproducts, only the surface layer portions need to be removed and replaced, or cleaned and reinstalled. Consequently, in the case of the gate valve or clamp means, mechanical components need not be disassembled, while in the case of gas emitting means, only the surface layer portions need to be replaced. Therefore the time needed for replacement is shortened and the apparatus downtime is reduced.

DETAILED DESCRIPTION OF THE PREFERRED EMBODIMENTS

FIRST EMBODIMENT

Following is a description of a first embodiment of this invention with reference to the attached drawings.

Figure 1:
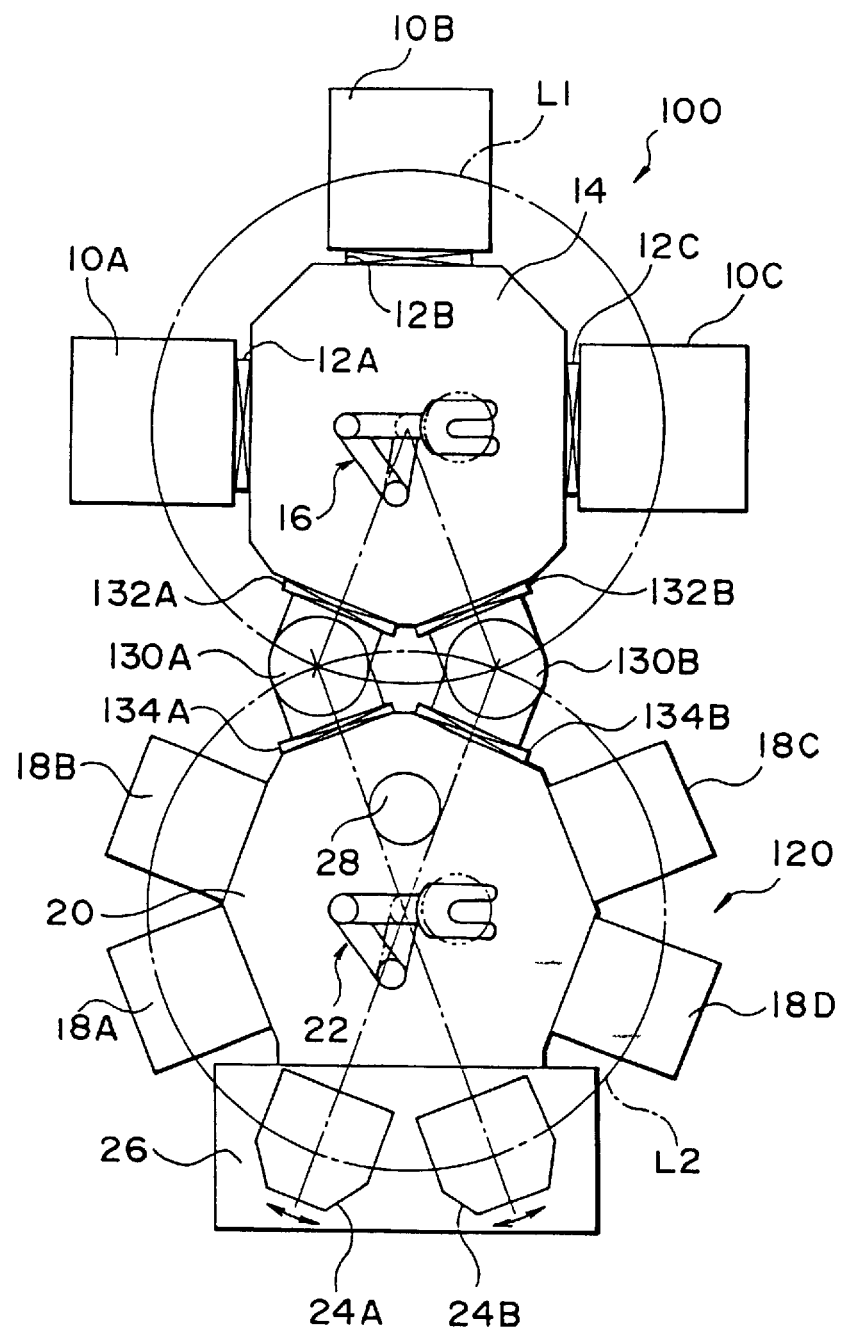
FIG. 1 is an abbreviated plan view of a reduced pressure and normal pressure treatment apparatus according to the first embodiment.

FIG. 1 is an abbreviated plan view indicating general construction of a reduced pressure and normal pressure treatment apparatus according to the first embodiment of the present invention. According to this embodiment, the reduced pressure and normal pressure treatment apparatus is constructed as what is termed a cluster tool system whereby transport means such as a robot arms are disposed in the radial direction about the periphery of a positioning chamber for continuously treating treatment objects (wafers).

The reduced pressure and normal pressure treatment apparatus comprises a reduced pressure treatment unit 100 and a normal pressure treatment unit 120, respectively communicating with a load lock chamber 130. The respective process treatments are conducted by the treatment units 100 and 120.

The reduced pressure treatment unit 100 comprises a plurality of reduced pressure process treatment chambers 10A, 10B and 10C performing reduced pressure treatment of the treatment objects, a reduced pressure transport chamber 14 communicating via first valve devices 12A, 12B and 12C with the respective reduced pressure process chambers 10A, 10B and 10C, and a first transport means 16 transporting the treatment objects to and from the respective reduced pressure process chambers 10A, 10B and 10C.

The first valve devices 12A, 12B and 12C utilize gate valves (referred to below as first gate valves 12A, 12B and 12C) capable of being opened and closed. In the open state, the reduced pressure transport chamber 14 is coupled with the reduced pressure process treatment chambers 10A, 10B and 10C.

As shown in FIG. 1, the cross-section of the reduced pressure transport chamber 14 is formed in a polygonal shape, thereby forming reduced pressure spaces to enable coupling the respective reduced pressure process treatment chambers 10A, 10B and 10C via the first gate valves 12A, 12B and 12C. According to the present embodiment, the respective reduced pressure process chambers 10A, 10B and 10C are disposed at symmetrical positions about the vertical axis center line.

The first transport means 16 comprising a robot arm (referred to below as the first robot arm 16) is disposed at the center of the reduced pressure transport chamber 14 and is capable of rotating about this center as the center of rotation. The first robot arm 16 comprises a multi-jointed arm and a surface for supporting the treatment object. The dashed line in FIG. 1 indicates the maximum transport range L1 determined by the end of the arm at maximum extension.

The vacuum within the reduced pressure transport chamber 14 is set, for example, between $10^{-3}$ to $10^{31\ 6}$ Torr.

The above mentioned three reduced pressure process treatment chambers 10A, 10B and 10C can be used, for example, as CVD treatment units for conducting the same or different types of film growth continuously or in parallel. Alternatively, the three chambers can be constructed to respectively perform etching treatment, or two chambers for etching treatment and the remaining chamber for ashing treatment to remove resist. Another possible configuration is to use two chambers for the same or different types of CVD treatment and the remaining chamber for etching treatment to remove the natural oxidation film formed on the treatment object surface prior to CVD treatment.

The normal pressure treatment unit comprises a plurality of normal pressure process treatment chambers 18A, 18B and 18C for normal pressure treatment of treatment objects, a normal pressure transport chamber 20 communicating with the normal pressure process treatment chambers 18A, 18B, 18C and 18D, and a second transport means 22 transporting the treatment objects to and from the respective normal pressure process treatment chambers 18A, 18B and 18C.

The normal pressure process treatment chambers are sites for processing treatment objects at atmospheric or greater positive pressure. According to the present embodiment, the respective normal pressure process treatment chambers 18A, 18B, 18C and 18D are disposed at symmetrical positions about the vertical axis center line indicated in FIG. 1.

FIG. 1 indicates an example of disposing the normal pressure process treatment chambers 18A, 18B, 18C and 18D as two sets of respective cleaning chambers 18A and 18C, and drying chambers 18B and 18D. As a result, prior to transporting the treatment objects into the reduced pressure process treatment chamber 10, the treatment objects can be cleaned with, for example, hydrofluoric acid or pure water in the cleaning chambers 18A and 18C, and dried in the drying chambers 18B and 18D. Also, after completion of treatment in the reduced pressure process treatment chambers 10A, 10B and 10C, the treatment objects can be cleaned with, for example, hydrofluoric acid or pure water in the cleaning chambers 18A and 18C, dried in the drying chambers 18B and 18D and returned to the wafer cassette. Spinning can also be used when cleaning or drying the treatment objects.

The use of the normal pressure process treatment chambers 18A, 18B, 18C and 18D is not limited to the above example and alternative constructions are possible according to the types of normal pressure treatment required before or after reduced pressure treatment. As another example, when etching is conducted in the reduced pressure process treatment chambers 10A, 10B and 10C, a baking process for removing residual chlorine from the resist can be conducted in any of the normal pressure process treatment chambers 18A, 18B, 18C and 18D. After conducting the baking process, the treatment objects can be cooled in another of the normal pressure process treatment chambers 18A, 18B, 18C and 18D, and returned to the cassette.

In the case of this type of normal pressure treatment unit, although treatment can be performed under the natural atmosphere, a preferred setting is a somewhat higher positive pressure than natural atmosphere. An inert gas such as $N_2$, $CO_2$ or Ar gas can be used for setting to a positive pressure, thereby preventing the incursion of impurities and allowing their expulsion.

The cross-section of the normal pressure transport chamber 20, as indicated in FIG. 1, is formed in a polygonal shape and communicates with the inputs of the respective normal pressure process treatment chambers 18A, 18B, 18C and 18D. A second transport means comprising a robot arm (referred to below as the second robot arm 22) is disposed at the center of the normal pressure transport chamber 20 and is capable of rotating about this center as the center of rotation. In the case of the present embodiment, the respective normal pressure process treatment chambers 18A, 18B, 18C and 18D are disposed at symmetrical positions about the vertical axis center line of the normal pressure transport chamber 20.

The second robot arm 22 comprises a multi-jointed extendable and retractable arm having an end capable of holding the treatment object by vacuum adhesion. The dashed line L2 in FIG. 1 indicates the maximum transport range at maximum extension.

Mutually overlapping locations are set for the respective transport ranges L1 and L2 of the first and second robot arms 16 and 22, and the load lock chambers 130A and 130B are disposed at these locations.

Thus, in the case of the present embodiment, the load lock chambers 130A and 130B are disposed at symmetrical positions on a line joining the rotational centers of the first and second robot arms 16 and 22. In addition, the load lock chambers 130A and 130B are disposed with a treatment object transfer space provided at the location where these transport ranges overlap. Also, second and third gate valves (referred to below as second gate valves 132A and 132B, and third gate valves 134A and 134B respectively) are installed respectively at the load lock chamber 130 positions communicating with the reduced pressure transport chamber 14 and normal pressure transport chamber 20.

The load lock chambers 130A and 130B perform mutual exchange between the atmosphere and vacuum. For this reason, when shifting a treatment object from the normal pressure transport chamber 20 to the reduced pressure transport chamber 14, the atmosphere is changed from normal to a vacuum. Conversely, when shifting a treatment object from the reduced pressure transport chamber 14 to the normal pressure treatment chamber 20, the atmosphere is changed from vacuum to normal. Heating and cooling mechanisms (not shown) can also be provided in the load lock chambers 130A and 130B. In this case, a treatment object can be preheated when transferring from the normal pressure transport chamber into the reduced pressure treatment unit 100, as well as cooled when transferring from the reduced pressure treatment unit 100 into the normal pressure treatment unit 120. By preheating in cases where the treatment object is treated at high temperature in the reduced pressure process chamber 10, the heating time required for reaching the treatment temperature can be shortened. Conversely, by cooling, formation of excess oxidation film can be prevented when the treatment object is transported out of the reduced pressure treatment unit 100 in the high temperature state and contacts the atmosphere.

When these types of preheating and cooling are provided in the load lock chambers 130A and 130B, since the treatment object can be surrounded by a vacuum thermal insulating atmosphere or heat transmitting atmosphere, efficient heating and cooling can be achieved.

As containers for a plurality of treatment objects, cassettes 24A and 24B are disposed at one facet of the polygon shaped normal pressure transport chamber 20 not occupied by the normal pressure process chambers 18A–18D and load lock chambers 130A and 130B.

The cassettes 24A and 24B are disposed on a cassette stage 26 at symmetrical positions on a line joining the centers of the reduced pressure transport chamber 14 and normal pressure transport chamber 20.

Directing the cassette 24A and 24B openings toward the robot arm 22 center of rotation is preferred in order to enable the robot arm 22 to securely transport the treatment objects into and out of the cassettes 24A and 24B. Consequently, the cassettes 24A and 24B are set so as to allow shifting as indicated by the arrows in FIG. 1 for directing their positions toward this center of rotation.

In the case of a reduced pressure and normal pressure treatment apparatus comprising this type of construction, treatment objects transported from the respective cassettes 24A and 24B are returned to the same cassette from which they were removed. When the cassette or carrier differs between the times of removal and return, the risk of cross-contamination increases. Another reason is that in recent years, manufacturing quality control for each lot has come to be performed utilizing such means as an ID code applied to the cassette or carrier, thus requiring transport from and return to the same cassette or carrier.

Element 28 in FIG. 1 indicates a table comprising the treatment object alignment means. The table 28 comprises a vacuum chuck capable of holding the treatment object by suction, rotating, and moving up and down. Also, a transmission type sensor (not shown), for example, is disposed over the vacuum chuck. As a result, orientation flat alignment is performed by means of the signal from the transmission type sensor and the table drive mechanism whereby the treatment object held by suction is aligned to a predetermined position.

The operation according to the present embodiment when the access distance for transporting the normal pressure process treated treatment object to and from the reduced pressure process treatment unit has been shortened in this manner is as follows. In the initial state, the first—third gate valves 12A–12C, 132A, 132B, 134A and 134B are held in the closed state.

The operator manually or by a robot arm places the cassettes 24A and 24B on the cassette stage 26. The cassettes 24A and 24B are adjusted to direct the openings toward the second robot arm 22 center of rotation.

After placing and adjusting the directions of the cassettes 24A and 24B, the distal end of the second robot arm 22 is inserted under one semiconductor wafer or other treatment object contained in the cassette 24A or 24B. The cassette 24A or 24B is then slightly lowered by the stage 26 and the robot arm 22 distal end holds the treatment object by suction.

Figure 2:
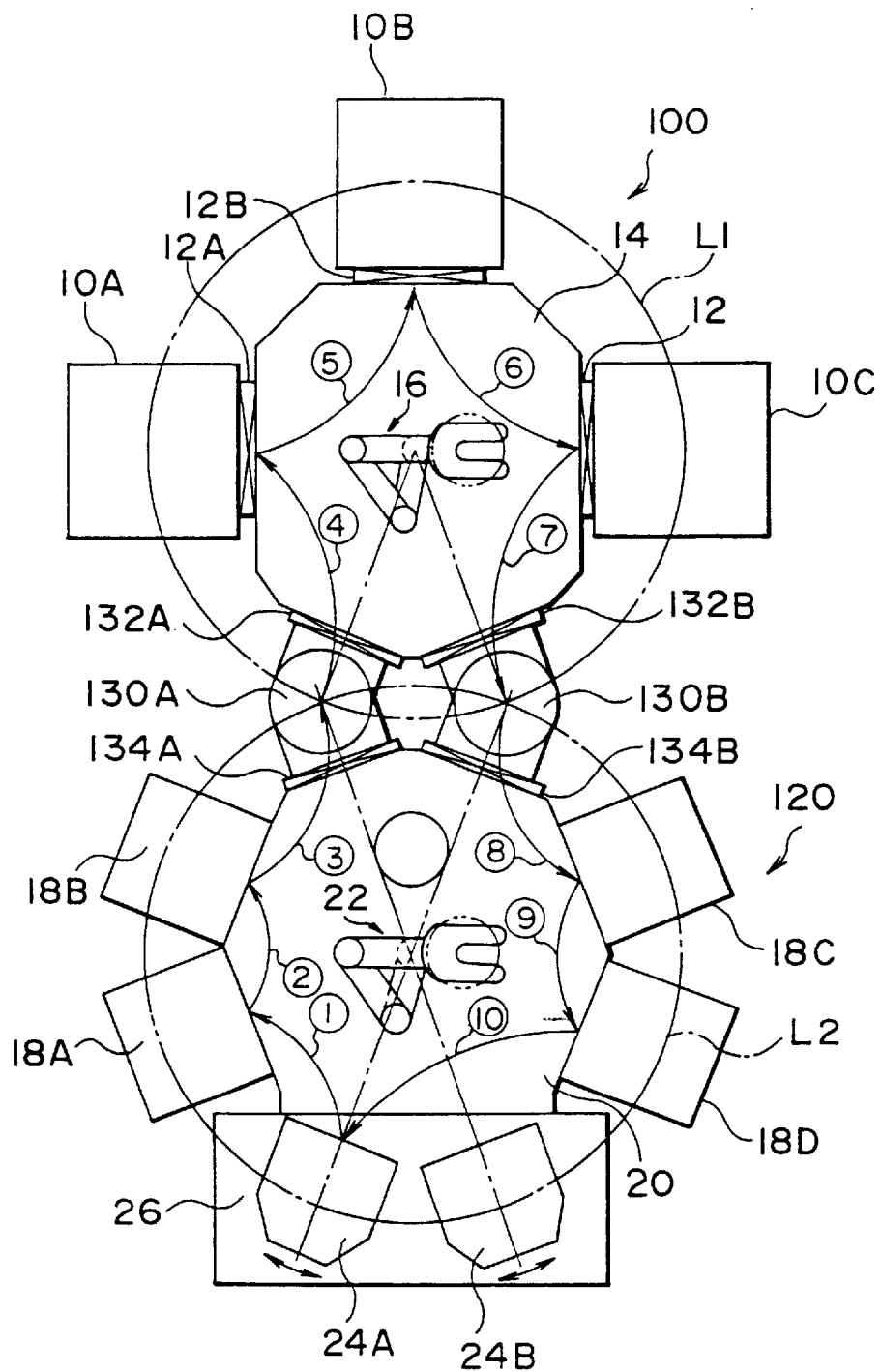
FIG. 2 is an abbreviated plan view for describing an example of treatment object transport with respect to the reduced pressure and normal pressure treatment apparatus shown in FIG. 1.

As indicated by arrow ①in FIG. 2, a treatment object removed from cassette 24A is conveyed by the robot arm 22 to the cleaning process treatment chamber 18A of the normal pressure treatment chambers. After completion of the cleaning process, the treatment object is removed from the treatment chamber 18A by the robot arm 22 and as indicated by arrow ②, conveyed to the drying process chamber 18B of the normal pressure process chambers. Although not shown by the arrows, the treatment object is aligned by the alignment section 28 before cleaning or after drying.

After the drying process, the treatment object is removed from the process chamber 18B and, as indicated by arrow ③, conveyed to one load lock chamber 130A. In this case, the closed third gate valve 134A is opened to enable inserting the treatment object.

After the treatment object is inserted in the load lock chamber 130A, the third gate valve 134A is closed then the interior is set to approximately the same atmosphere as the reduced pressure transport chamber 14. The gate valve 132A is then opened. The above mentioned preheating can also be performed during this conversion from normal to vacuum atmosphere.

The first robot arm 16 located in the reduced pressure transport chamber 14 removes the treatment object from the load lock chamber 130A and, as indicated by arrow ④, conveys the treatment object to the reduced pressure process treatment chamber 10A.

The first gate valve 12A is closed and the interior atmosphere of the reduced pressure process treatment chamber 10A containing the treatment object is reduced to a lower pressure than the reduced pressure transport chamber 14. The ambient atmosphere is reduced to a higher degree of vacuum as the treatment object is transferred from normal pressure to the load lock chamber 130A, reduced pressure transport chamber 14 and reduced pressure process treatment chamber 10A. The first predetermined reduced pressure treatment is then conducted in the reduced process treatment chamber 10A.

At completion of the first reduced pressure process treatment, as indicated by arrows ⑤ and ⑥, the robot arm 16 conveys the treatment object via the reduced pressure transport chamber successively to the reduced pressure process treatment chambers 10B and 10C where respective second and third reduced pressure process treatments are conducted.

Following reduced pressure process treatment, as indicated by arrow ⑦, the treatment object is conveyed by the second robot arm 16 from the reduced pressure process treatment chamber 10C to the load lock chamber 130B, where the ambient atmosphere is converted from a vacuum to the normal atmosphere. The treatment object can also be cooled during this conversion in order to avoid producing unnecessary oxidation film when returning to the normal atmosphere.

After the atmosphere in the load lock chamber 130B is converted, the third gate valve 134B is opened and, as indicated by arrow ⑧, the treatment object is conveyed by the second robot arm 22 to the normal pressure process treatment chamber 18C, where, for example, a cleaning process is conducted.

When treatment in the normal pressure process treatment chamber 18C is finished, as indicated by arrow ⑨, the treatment object is conveyed by the robot arm 22 from the normal pressure process treatment chamber 18C to the normal pressure process treatment chamber 18D, where a drying process is performed.

When the drying process in the normal pressure process treatment chamber 18D is completed, the treatment object is returned, as indicated by arrow ⑩, to the same cassette 24A (in this example) from which it was removed. A preferred method at this time is to place the treatment object on the table 28, align the orientation flat and return the treatment object to the cassette 24A.

The treatment objects transported from the cassettes 24A and 24B undergoing various types of treatment and are returned to the same cassette from which they were extracted. As a result, the treatment objects contained in the cassette can be controlled according to an ID applied to the cassette. In addition, since the treatment objects are removed and returned to the same cassette, the risk of cross-contamination is absent, thereby allowing measures such as cleaning for removing deposited matter to be abbreviated.

The treatment object removal and return procedure is not limited to the above described example. In other words, the treatment object removal and return procedure can be changed according to the number of treatment processes.

Figure 3:
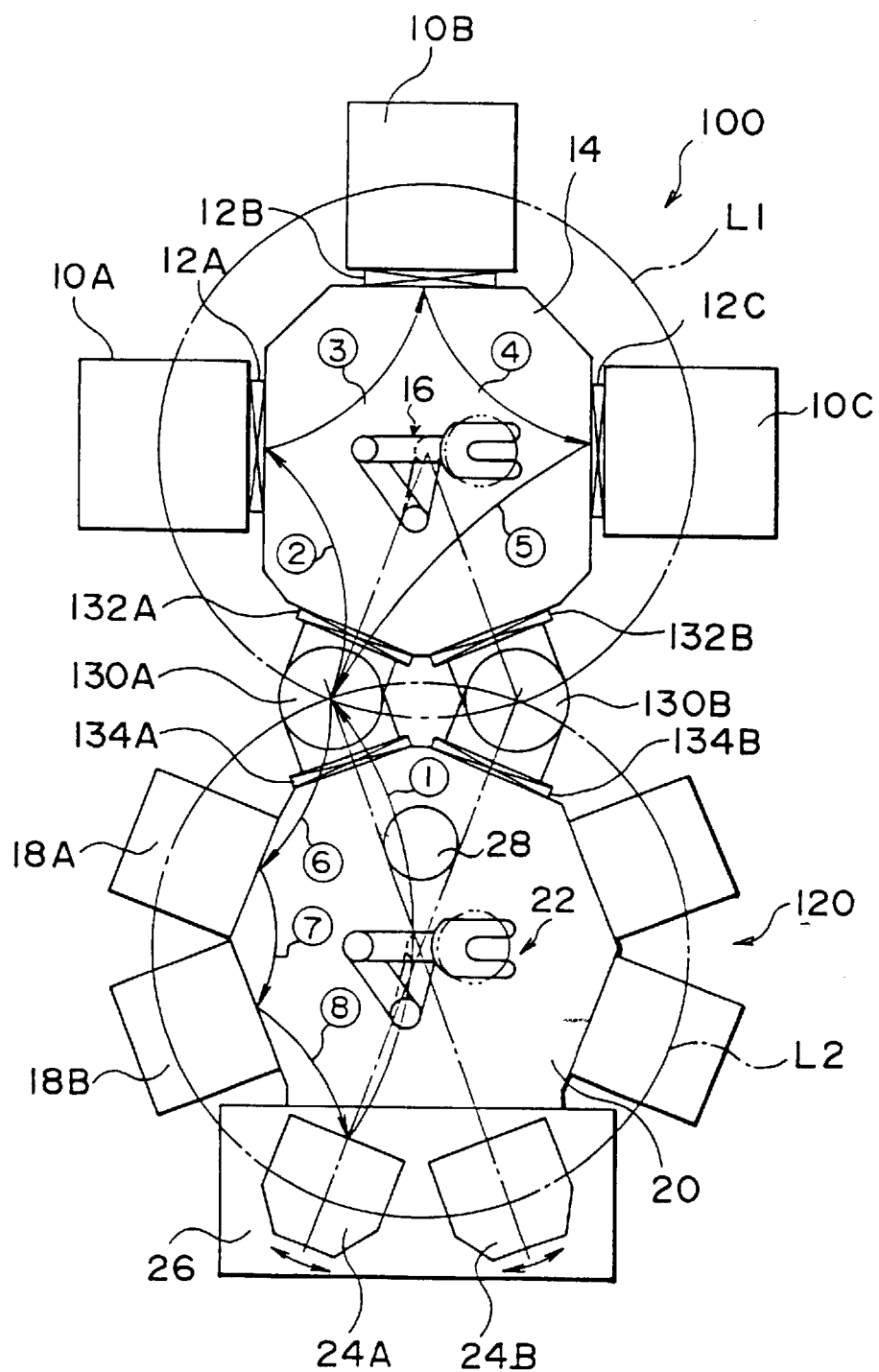
FIG. 3 is an abbreviated plan view for describing another example of treatment object transport with respect to the reduced pressure and normal pressure treatment apparatus shown in FIG. 1.

FIG. 3 shows another treatment object transport procedure. In this example, normal pressure process treatment is conducted only after reduced pressure process treatment. The procedure starts, as indicated by arrow 1 in FIG. 3 when the second robot arm 22 transfers a treatment object from one of the cassettes 24A or 24B to one of the load lock chambers 130A having an open third gate valve 134A. During this operation, the treatment object is aligned by the alignment means 28.

The treatment object is then conveyed in sequence, for example, to the three reduced pressure process treatment chambers 10A–10C, as indicated by arrows ②–④, where the same or different reduced pressure processes are conducted.

At completion of the process in the reduced pressure process treatment chamber 10C, the first gate valve 12C opens and, as indicated by arrow ⑤ in FIG. 3, the first robot arm 16 transfers the treatment object to the load lock chamber 130A. In the transfer sequence indicated in FIG. 3, the treatment objects are transferred to and from the cassette 24A at the left of the figure using the load lock chamber 130A. For this reason, by also transferring treatment objects to and from the cassette 24B at the right of FIG. 3 using the right load lock chamber 130B, parallel processing can be conducted for the treatment objects contained in the left and right cassettes 24A and 24B.

After converting the atmosphere with the load lock chamber 130A in the same manner as described above, as indicated by the arrows ③ and ⑦ in FIG. 3, the treatment objects are transferred sequentially by the second robot arm 22 to the normal pressure process treatment chambers 18A and 18B. As an example of normal pressure treatment, after a process such as etching in the reduced pressure process chamber 10, a baking process is conducted in the treatment chamber 18A for removing chlorine gas contained in the resist. The treatment object (wafer) is then cooled in the treatment chamber 18B. After completing the two normal pressure process treatments, as indicated by arrow ⑧ in FIG. 3, the second robot arm 22 returns the treatment object to the original cassette 24A.

The above descriptions referred to various examples wherein the cassettes 24A and 24B provided for containing the treatment objects were shifted on the cassette stage 26 in order to direct the cassette openings toward the robot arm center of rotation. However, this is not a limitation and other cassette quantities and cassette setting methods can also be used.

Figure 4:
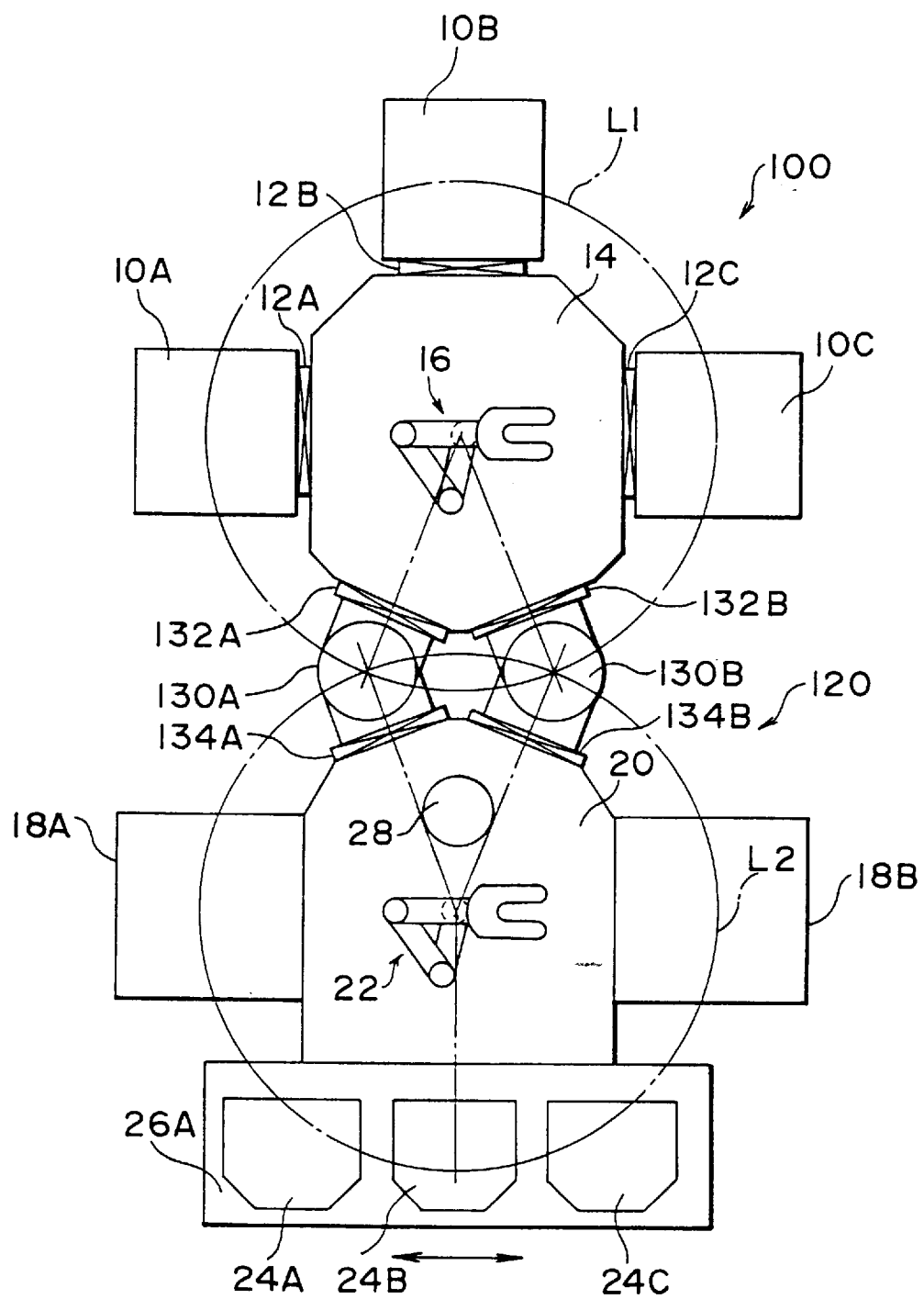
FIG. 4 is an abbreviated plan view of a variation of the reduced pressure and normal pressure treatment apparatus shown in FIG. 1.

FIG. 4 shows an example comprising three cassettes and a stage 26A capable of shifting linearly as indicated by the arrows in order to position one of these cassettes within the transport range L2 of the robot arm.

In this case, the cassettes 24A, 24B and 24C are set on the horizontally shifting stage 26A. One of the cassettes 24A–24C set on the cassette stage 26A is stopped at a position opposite the second robot arm 22. In the state shown in FIG. 4, the treatment objects housed in the central cassette 24B can be removed and reinserted.

An alternative system for transferring the treatment objects can also be adopted, such as utilizing one of the normal pressure process chambers disposed in the normal pressure treatment unit 120 as the treatment object transfer site and providing an additional treatment unit comprising a robot arm.

Figure 5:
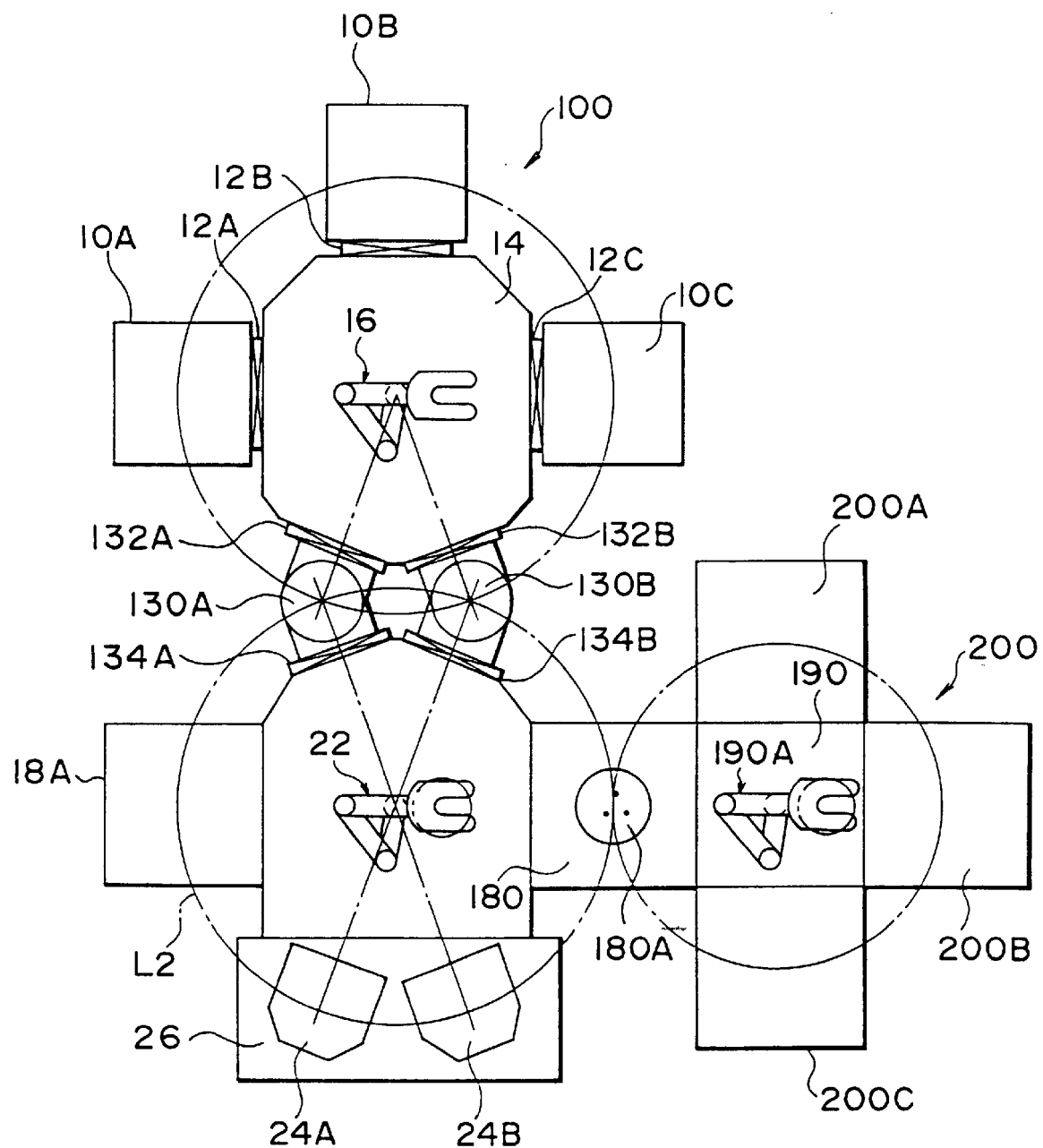
FIG. 5 is an abbreviated plan view of a further variation of the reduced pressure and normal pressure treatment apparatus shown in FIG. 1.

FIG. 5 illustrates this example disclosed right above. A normal pressure process treatment chamber (indicated by 180 in FIG. 5) of the normal pressure treatment unit 120 comprises an internal treatment object placement portion 180A adjacent to a second normal pressure transport chamber 190. The second normal pressure transport chamber 190 comprises a robot arm 190A having a distal end positioned at maximum extension in the overlap location of the second robot arm 22 transport range L2 of the normal pressure transport chamber 120n and a plurality of normal pressure process chambers 200A, 200B and 200C disposed at positions equally distant from the robot arm 190A center of rotation.

An advantage according to this example is construction allowing the number of normal pressure process treatment chambers to be expanded beyond the rotational transport range of a single robot arm 22. Also, in a case of conducting special types of treatment, for example, the normal pressure process chambers 200A, 200B and 200C can be located at separated positions for avoiding adverse effects on the reduced pressure treatment unit 100 and normal pressure treatment unit 120.

Figure 6:
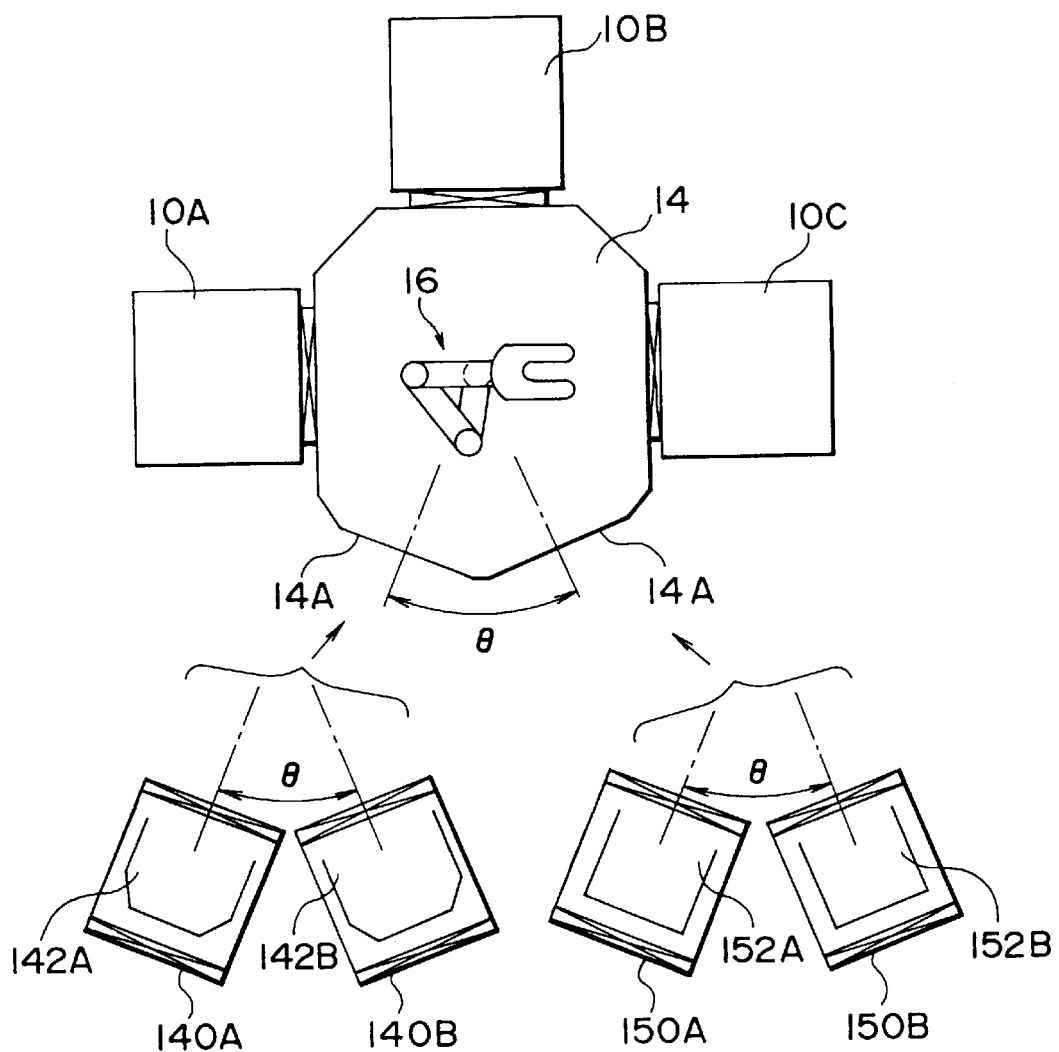
FIG. 6 is an explanatory view of construction whereby a plurality of different type load lock chambers can be connected in common to the reduced pressure chamber used with the reduced pressure and normal pressure treatment apparatus shown in FIG. 1.

Following is a description of adopting a general purpose construction for the reduced pressure treatment unit 100. As shown in FIG. 6, the reduced pressure transport chamber 14 of the reduced pressure treatment unit 100 comprises an interface 14A for securely connecting, for example, two load lock chambers wherein each type of load lock chamber comprises a common shape and can be alternatively connected.

In addition to the load lock chambers 130 shown in FIGS. 1–5, the FIG. 6 construction allows connecting two two different types of load lock chambers to the reduced pressure transport chamber 14.

One set of load lock chambers 140A and 140B indicated in FIG. 6 can accommodate cassettes 142A and 142B constructed of SEMI standard type plastic. The cassettes 142A and 142B can be formed of polytetrafluoroethylene or polypropylene. The other set of load lock chambers 150A and 150B indicated in FIG. 6 are intended for high vacuum operation and can accommodate metallic cassettes 152A and 152B. The cassettes 152A and 152B are formed of metal in order to avoid outgassing under high vacuum conditions. The cassette attachment interface 14A of general purpose reduced pressure transport chamber 14 connecting each type of load lock chamber according to the type of reduced pressure treatment has a shape common to both the above mentioned cassettes. Although the cassettes mentioned above are permitted to contact the atmosphere, SMIF boxes, for example, containing pluralities of cassettes can also be connected by a common method to the reduced pressure transport chamber 14.

The present invention is not limited by the above described embodiments and numerous variations are possible without departing from the scope and spirit of the invention. In particular, the types of reduced pressure process treatment and the types of normal pressure process treatment conducted before and after the reduced pressure process treatment are mentioned by way of example and are also applicable to numerous other types of process treatment required in semiconductor manufacture. Also, the foregoing embodiments referred to examples whereby one treatment object at a time was treated in the reduced and normal pressure process treatment units and the load lock chambers had the capacity of one treatment object. However, the load lock chamber capacities can also be set for accommodating a plurality of treatment objects. In this case, the subsequent treatment objects to be supplied to the reduced pressure process treatment chamber can be held at standby, thereby improving the work rate of the reduced pressure process treatment chamber and system throughput. This example also offers an advantage of reducing exposure of the load lock chambers to the atmosphere, thereby reducing the influx of atmospheric impurities and improving the treatment yield rate.

As described above, a reduced pressure and normal pressure treatment apparatus according to the first embodiment shortens the time interval between reduced pressure and normal pressure process treatment, in addition to reducing the treatment object handling frequency. As a result, the treatment quality and throughput can be improved. Also, in the case of this invention, the length of the transport route between the reduced pressure and normal pressure process treatment units can be set to the minimum required, thereby further shortening the interval between processes.

According to this invention, since a required treatment can be conducted immediately before or after transporting the treatment object between the reduced pressure and normal pressure treatment units, deterioration of the state obtained by such treatment due to time can be avoided when shifting the treatment object to one of the treatment units.

The load lock chambers can also be set to accommodate a plurality of treatment objects. Therefore, the next treatment object to be supplied to the reduced pressure process treatment chamber can be held at standby, thus enabling improved work rate and throughput.

According to this invention, the incursion of impurities into the reduced pressure and normal pressure treatment units can be prevented and treatment space cleanliness can be maintained, thereby improving treatment quality and yield.

SECOND EMBODIMENT

Figure 7:
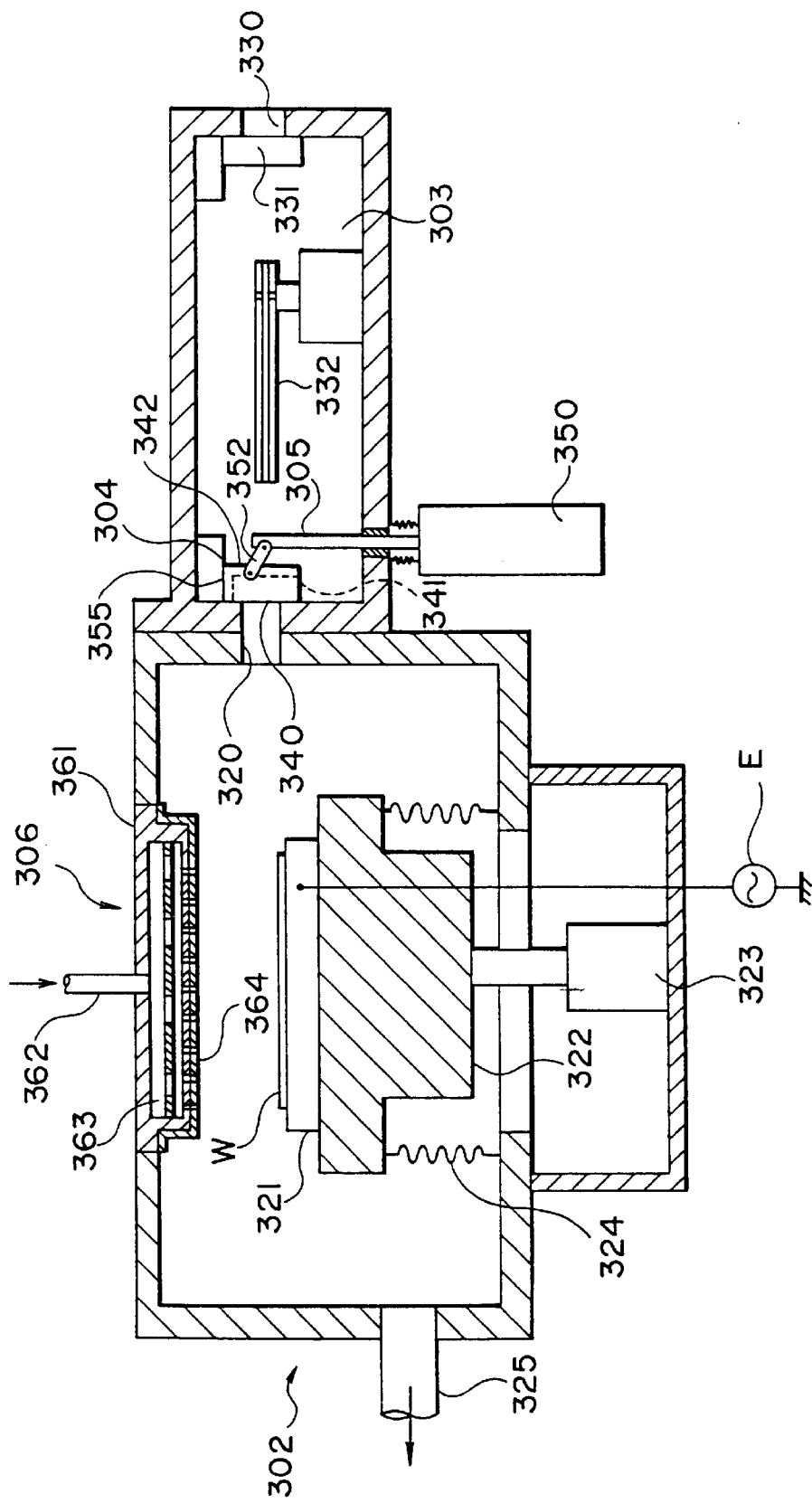
FIG. 7 is a cross-sectional view showing overall construction of a plasma etching apparatus used with the reduced pressure treatment chamber of the reduced pressure and normal pressure treatment apparatus shown in FIG. 1 according to the second embodiment.

FIG. 7 shows overall construction of a gate valve applicable to a plasma etching apparatus for a reduced pressure and normal pressure treatment apparatus according to a second embodiment of this invention. A load lock chamber 303 (corresponding to 130A and 130B in FIG. 1) serving as a preparatory vacuum chamber is connected through a transport opening 320 to a treatment chamber 302 (corresponding to 10A–10C in FIG. 1) having gas-tight construction. The load lock chamber 303 serves to prevent direct entry of atmospheric air into the treatment chamber 302. The load lock chamber 303 comprises gate valves 304 and 331 respectively opening and closing the treatment chamber 302 side transport opening 320 and atmosphere side transport opening 330, and a transport means (robot) 332 comprising, for example, a multi-jointed arm transferring wafers between the atmosphere and the process chamber 302 interior.

Figure 8:
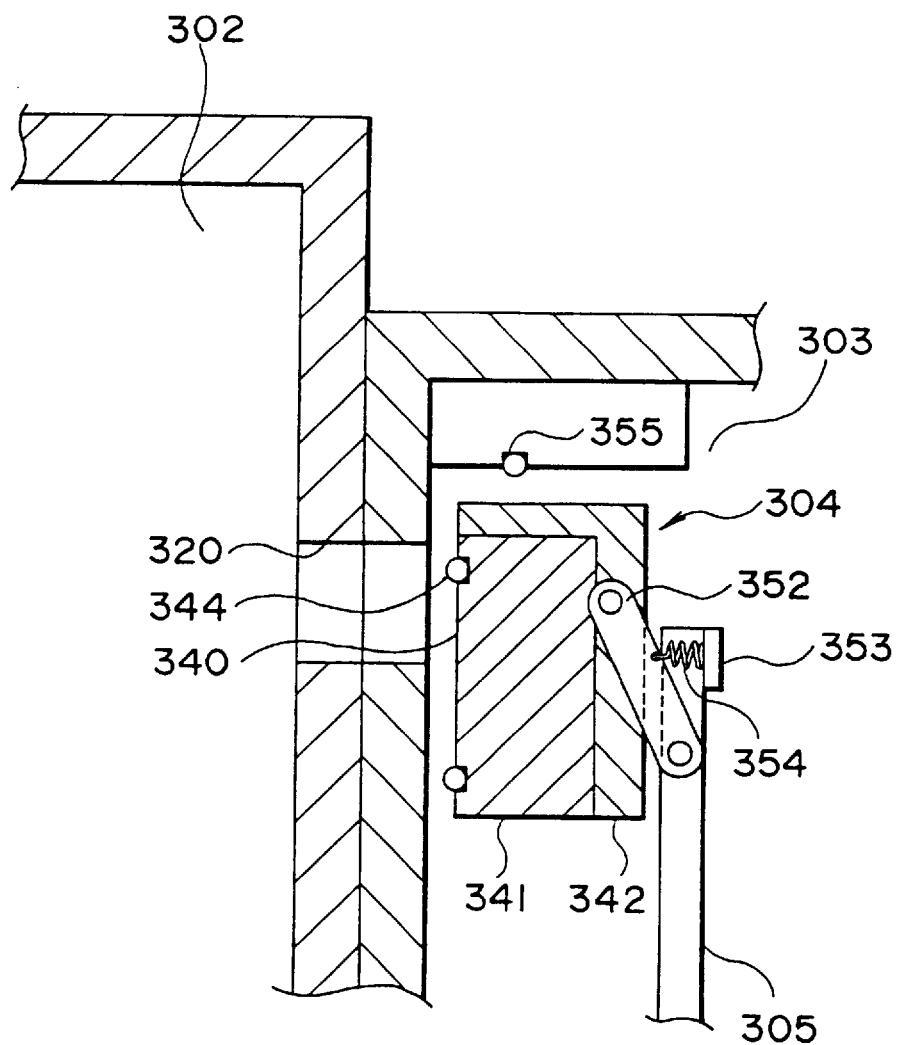
FIG. 8 is a cross-sectional view of a gate valve used in the plasma etching apparatus shown in FIG. 7.
Figure 9:
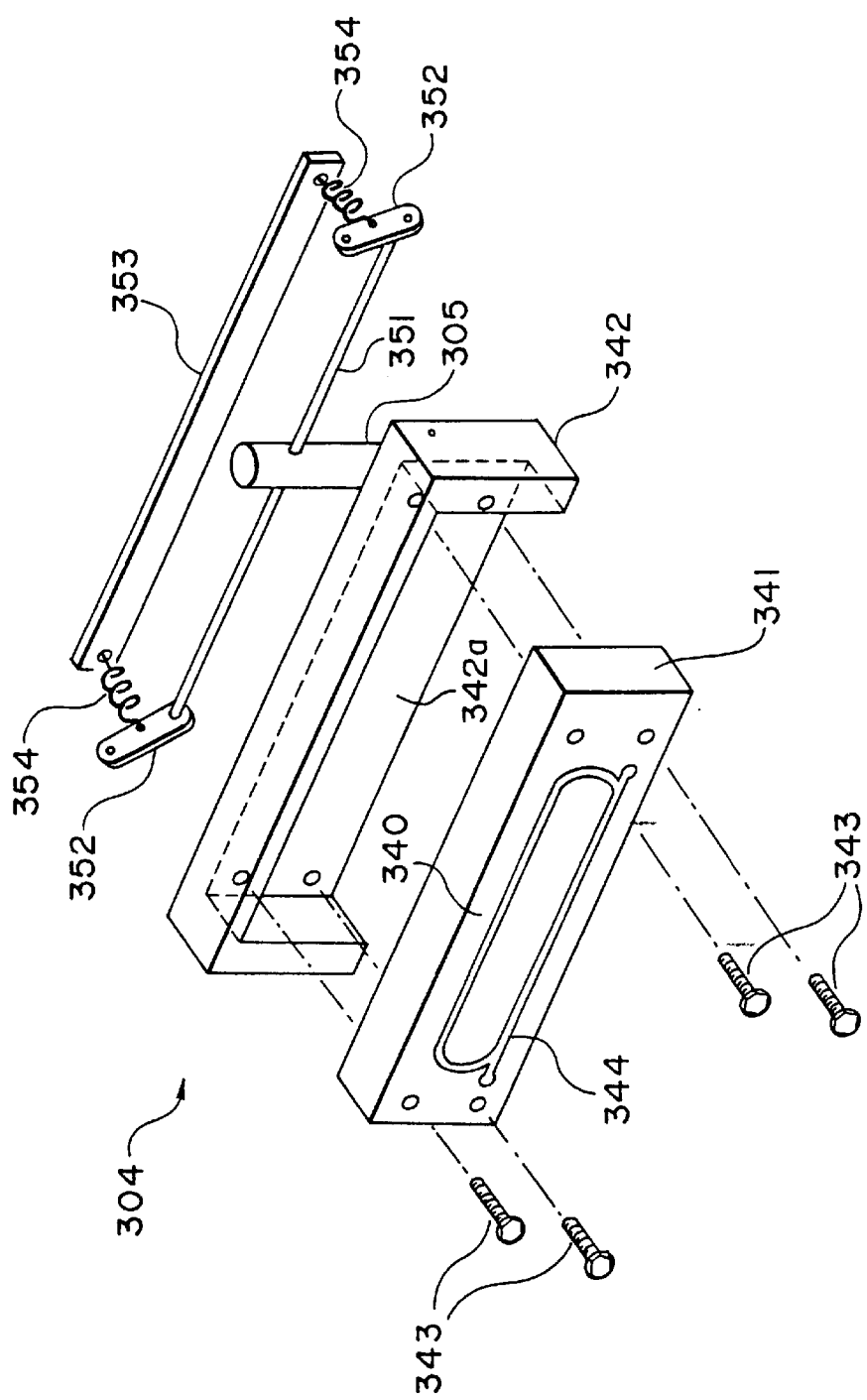
FIG. 9 is an exploded perspective view of the gate valve shown in FIG. 8.

As shown in FIG. 8, the gate valve 304 (corresponding to 12A–12C in FIG. 1) comprises a multi-layer construction wherein a surface 340 contacts the treatment gas in the treatment chamber 302, a surface layer portion 341 formed as part of the treatment chamber 302 inner wall, and a substrate portion 342 formed as the rear face of the surface layer portion 341. The substrate portion 342 comprises, for example, aluminum or stainless steel has the front face side (transport opening 320 side), as indicated in FIG. 9, formed in a reverse C shape enclosing the rear face, i.e., formed in a shape leaving thick portions at the top, both sides and the rear. The surface layer portion 341 is formed in a shape matching the front face cutout portion of the substrate portion 342, engaging tightly with the cutout portion 342a of the substrate portion 342, and can be freely attached and removed by means of four corner bolts 343.

Since the front face portion is contacted by chlorine ions during plasma etching, it needs to comprise material resistant to corrosion and plasma shock and having high mechanical strength; such as polybenzimidazole, alumina ceramics, quartz glass, aluminum nitride or teflon type plastic. Since the substrate portion 342 contacts the atmosphere in the treatment chamber 302, although it does not require high corrosion resistance and can comprise material such as stainless steel, the same material as the front layer portion 341 can also be used. As indicated in FIG. 9, when the gate valve 304 closes the wafer transport opening 320, an O-ring 344 is provided at the front layer portion 341 surface so as to enclose the transport opening 320 in order to provide a gas-tight seal between the treatment chamber 302 and the load lock chamber 303.

An elevator means 350 comprising a ball screw and air cylinder driving an elevator shaft 305 is disposed at the rear of the gate valve 304. The gate valve 304 is attached to both side faces of the substrate portion 342 via rotary arms 352 provided at both ends of a support beam extending horizontally from the top of the elevator shaft 305, thus comprising a link (toggle link) construction. Also, return force is applied by springs 354 disposed between a securing plate 353 secured to the elevator shaft 305 and the rotary arms 352 when the rotary arms 352 turn forward beyond a predetermined angle (when the elevator shaft 305 and gate valve 304 are separated more than a predetermined distance), As indicated in FIG. 8, a guide roller 355 is disposed at a location opposing the top of the gate valve 304 in the load lock chamber 303 for guiding the gate valve in the forward direction. The gate valve 304 raises together with the elevator shaft 305 and after contacting the guide roller 355, the gate valve 304 is pressed forward by the rotary arms 352 to seal the transport opening 320. Also, although the other gate valve 331 of the load lock chamber 303 indicated in FIG. 7 does not have the type of multi-layer construction of the gate valve 304, is comprises a similar construction using an elevator shaft and link mechanism (not shown) for opening and closing the transport opening 330.

In the process chamber 302, as shown in FIG. 7, a susceptor 321 comprising a lower electrode supporting a wafer W is supported by an insulating susceptor support means 322. The susceptor support means 322 can be raised and lowered by an elevator means 323 comprising e.g., an air cylinder and the space at the elevator means 323 position is gas-tightly separated from the treatment chamber 302 internal atmosphere by a bellows structure 324.

In addition, a gas emission means 306 opposing the susceptor 321 and supplying treatment gas is disposed at the upper part in the treatment chamber 302, and an exhaust tube 325 connected to a vacuum pump (not shown) is connected to a side of the treatment chamber 302. The gas emission means 306 comprises an upper electrode, a tubular shaped ventilation chamber 361 and a gas supply tube 362 connected to the top of the ventilation chamber 361. Gas diffusion plates 363 and 364 perforated with numerous holes are respectively disposed at the middle step and bottom of the ventilation chamber 361. The treatment gas from the gas supply tube 362 is diffused and mixed by the perforation holes of the gas diffusion plates 363 and 364, and supplied to the treatment chamber 302 interior.

Figure 10:
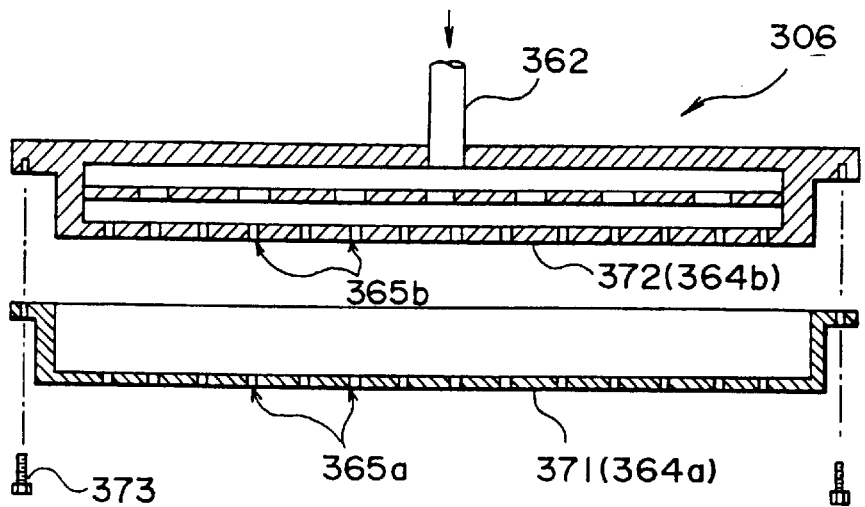
FIG. 10 is an exploded vertical cross-sectional view of a gas emission means used with the plasma etching apparatus shown in FIG. 7.

As indicated in FIG. 10, the gas diffusion means 306 comprises a multi-layer construction having a front layer portion 371 exposed to the treatment chamber 302 interior and a rear base portion 372. The front layer portion 371 is tightly engaged with the base portion 372 and can be attached by, for example, bolts 373 and removed. Consequently, the gas diffusion plate 364 is divided into a front layer portion 364a and a base portion 364b with numerous perforation holes for gas emission provided at respective corresponding positions. Parameters for selecting the materials for the front layer and base portions 371 and 372 are the same as the gate valve 304.

The susceptor (bottom electrode) 321 is connected to a high frequency power supply E and the gas emission means (upper electrode) 306 is grounded. High frequency power is thus applied between the electrodes 321 and 306.

Following is a description of the second embodiment operation. The transport means 332 in the load lock chamber 303 shown in FIG. 7 transports a treatment object, e.g., a wafer W, from the atmosphere side transport opening 330 into the load lock chamber 303. The gate valve 331 closes and the load lock chamber 303 is set to a predetermined vacuum. The gate valve 304 opens and the transport means 332 sets the treatment object on the susceptor 321 in the treatment chamber 302, after which the gate valve 304 closes. The elevator shaft 305 raises the gate valve 304 to where it contacts the upper part of the load lock chamber 303. The link operation of the rotary arms 352 then presses the gate valve 304 forward in conjunction with the guide roller 355 and tightly presses the gate valve 304 against the load lock chamber 303 inner wall, which functions as a valve seat. The transport opening 320 is sealed gas tight by an O-ring 344.

The treatment chamber 302 is preset to a vacuum, the wafer W is inserted therein and held on the susceptor by, for example, an electrostatic chuck. A treatment gas, such as chlorine ($Cl_2$) or hydrogen bromide (HBr), from the gas supply tube 362 is supplied at a predetermined flow rate through the gas emission means 306 to the treatment chamber 302 interior. The predetermined vacuum is maintained, while high frequency power is applied between the gas emission means (upper electrode) 306 and the susceptor (lower electrode) 321. As a result, the supplied $Cl_2$ or HBr gas forms a plasma for etching the, e.g., silicon dioxide $SiO_2$, film of the wafer W surface. After completion of etching, the treatment gas is exhausted, the wafer W is removed by the opposite process as the above described insertion and transported from the transport opening 330 to the atmosphere side. The susceptor is at the lowered position during wafer W transfer, but at the raised position near the gas emission means (upper electrode) 306 during plasma etching.

The gate valve 304 is one of the locations in the treatment apparatus where plasma is likely to collect during plasma etching.

When the above mentioned etching is performed repeatedly, since chlorine ions are highly corrosive, the surfaces of the gate valve 304 contacted by the plasma are corroded and become a source of generated particles. In the case of the second embodiment, since the gate valve 304 surface layer portion 341 exposed to plasma bombardment can be detached from the base portion 342, when the surface layer portion 341 surface is damaged beyond further usability, without need to replace the entire gate valve 304, the surface layer portion 341 only can be replaced by, for example, taking out the bolts 343 (see FIG. 9).

In order to replace the entire gate valve 304, the gate valve 304 must be separated from the elevator shaft 305. Also, the work is painstaking and requiring disassembly of the tension springs 354 and the rotary arms 352, which in practice involves numerous parts such as washers, bolts and nuts. However, in the case of the second embodiment, merely replacing the surface layer portion 321 is adequate, without need to handle the link mechanism and other components. Consequently, maintenance of the gate valve 304 is extremely easy, thereby shortening the apparatus downtime and improving throughput. The gas emission means 306 is also a location subjected to plasma concentration. As shown in FIG. 10, the gas emission means 306 has a multi-layer construction comprising surface layer and base portions 371 and 372, whereby the surface layer portion 371 can be freely removed from and reattached to the base portion 372. Consequently, when the gas emission means 306 surface is damaged, since replacing only the surface layer portion 371 is adequate, replacement work is easy and a cost advantage is provided in comparison to replacing the entire gas emission means 306.

Figure 11:
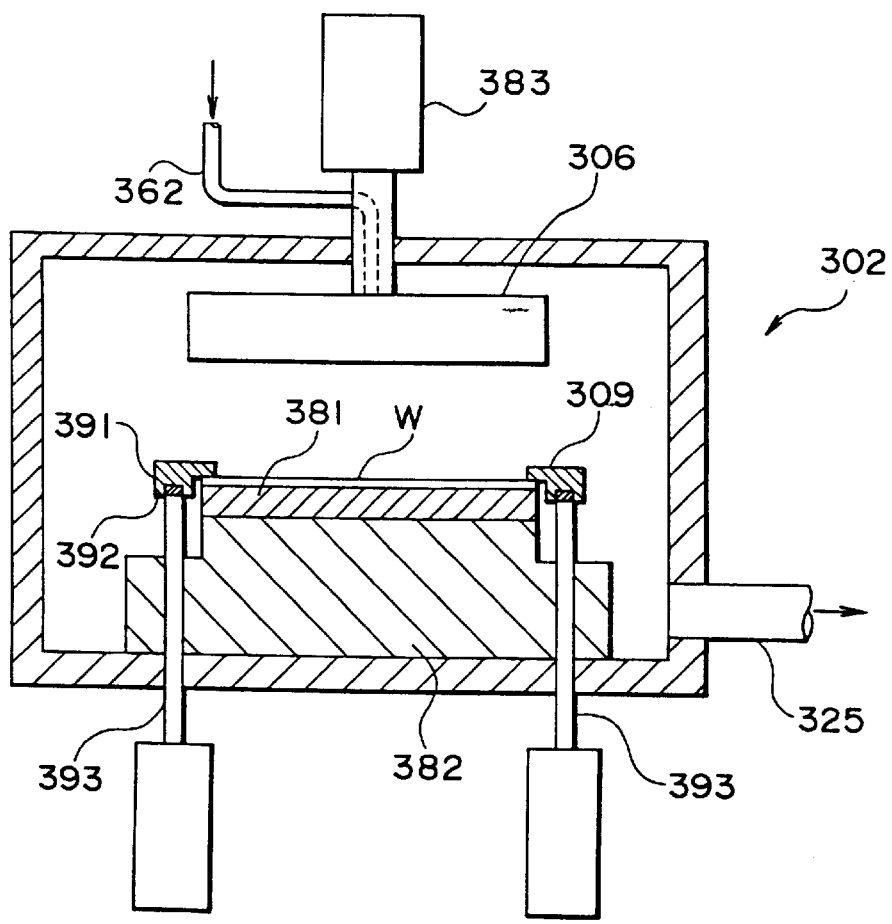
FIG. 11 is a vertical cross-sectional view showing overall construction of a variation of the plasma etching apparatus shown in FIG. 7.
Figure 12:
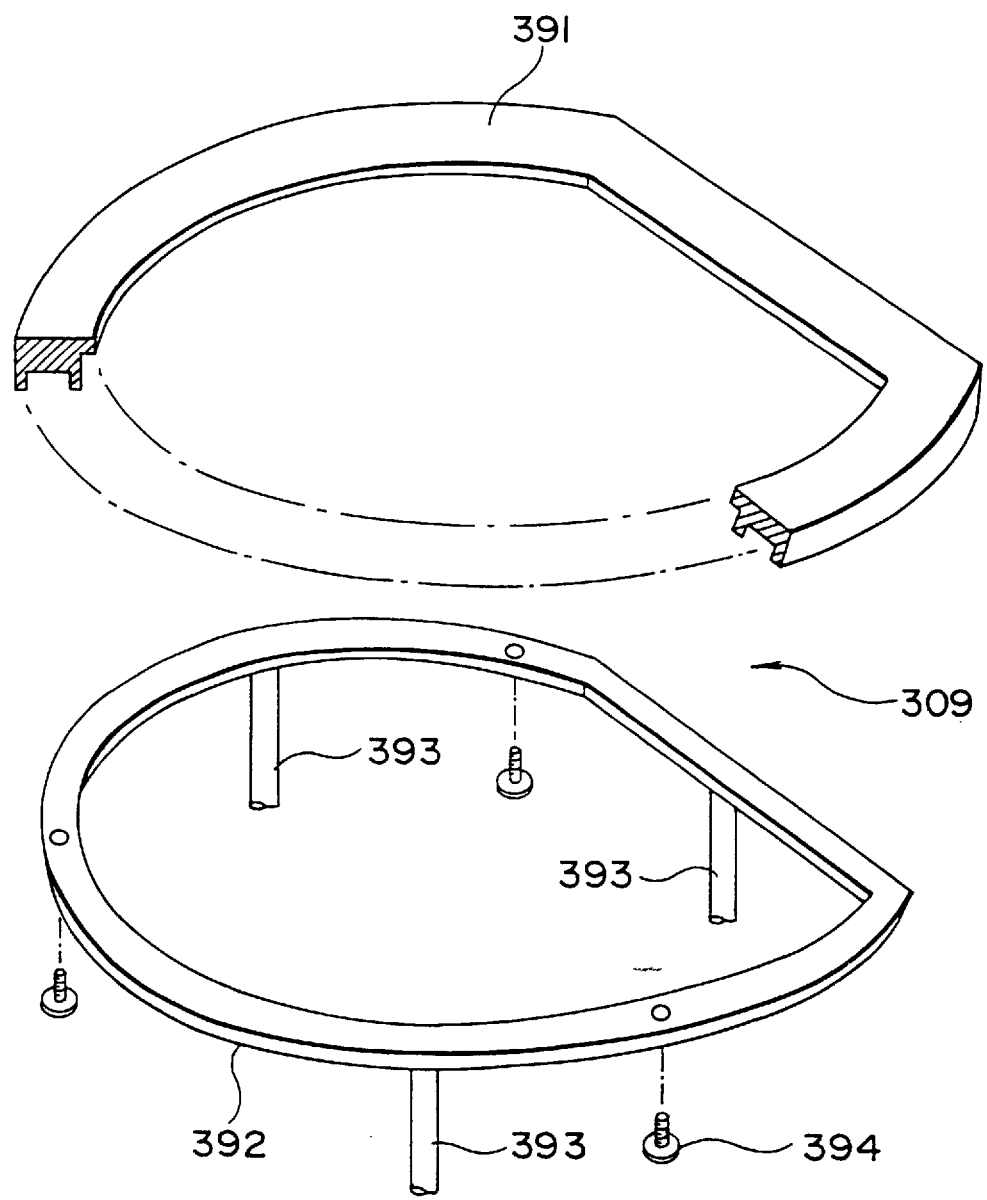
FIG. 12 is an exploded perspective view of a wafer clamp means used with the plasma etching apparatus shown in FIG. 11.
Figure 13:
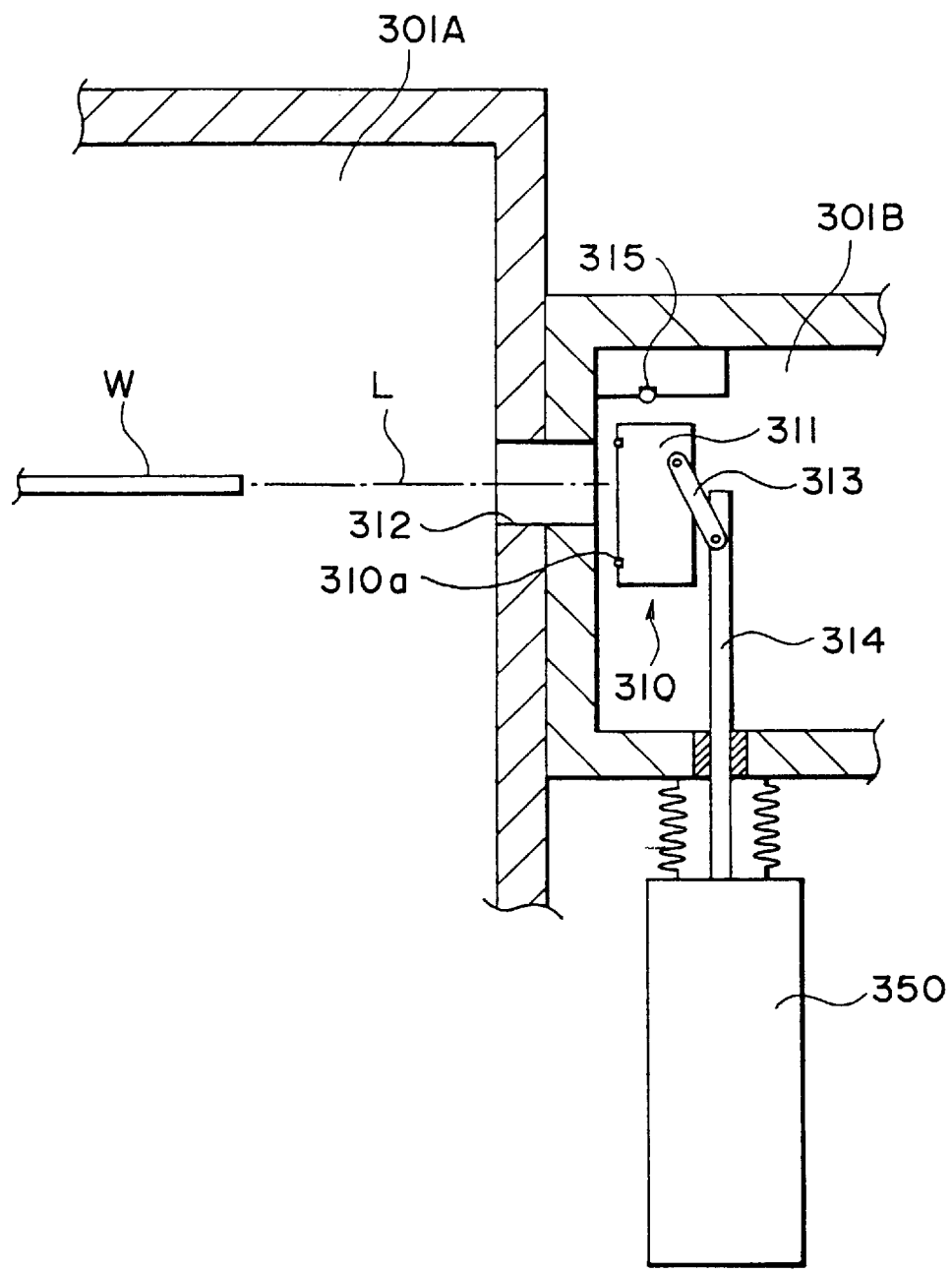
FIG. 13 is a partial cross-sectional view of a conventional gate valve.

A variation of the second embodiment is described below with reference to FIGS. 11 and 12. In the case of this variation, a surface layer portion 391 and the rear face base portion 392 thereof comprise a multi-layer construction. The wafer W is temporarily secured to a susceptor 381 by a mechanical clutch means 309 and exposed to the atmosphere in the treatment chamber 1. As indicated in FIG. 12, the clamp means 309 comprises a ring structure having a shape made to resemble the outer form of the wafer W and mounted at the upper ends of, for example, three elevator shafts 393.

The base portion 392 is secured to the respective elevator shafts. The surface layer portion 391 is shaped in a form to engage with the base portion 392 from the top and can be freely attached and detached with respect to the base portion 392 by means of, for example, screws 394. Parameters for selecting the materials for the front layer and base portions 391 and 392 are the same as the previously described gate valve. In FIG. 11, 382 is a susceptor support structure, an elevator means 393, and an elevator means 383 for bringing the gas emission means 306 toward and away from the susceptor 381. Items the same as indicated in FIG. 7 are designated by the same numbers. By using this type of clamp means 309 construction, when clamp means 309 maintenance is required due to damage from plasma, since replacing only the surface layer portion 391 is necessary, the replacement work is easy, and the apparatus downtime can be kept brief.

As described above, adopting multi-layer construction for the gate valve, gas emission means and clamp means is effective not only when conducting maintenance of the respective components in cases of damage due to plasma ion bombardment or ion corrosivity, and in cases of damage due to non-plasma but corrosive treatment gas, but also in cases where damage is not incurred, such as deposition of reaction byproducts, where components require cleaning rather than replacement. Also, the present invention is not limited to the above mentioned components, and the same type of effects can be obtained by using multi-layer construction for other components disposed on locations subject to plasma concentration or reaction byproduct deposition as well. The second embodiment of this invention is not limited to such processes as plasma etching and CVD, but is also applicable to apparatus performing such treatment as sputtering and ashing. (In the case of this invention, the term sputtering is defined to also include sputtering a target with plasma to form a sputter film on a treatment object.) As a result of the second embodiment, the maintenance of such components as the gate valve, gas emission means and treatment object clamp means can be conducted in a short time, thereby improving the apparatus work rate.

What is claimed is:

1. A treatment apparatus comprising a gas-tight treatment chamber and a gate valve opening and closing a treatment object transport opening formed in the treatment chamber, wherein:

a treatment object is treated by a treatment gas or plasma thereof;

the surface of the gate valve exposed to an atmosphere within the treatment chamber includes a multi-layer construction having a surface layer portion exposed to the atmosphere within the treatment chamber and a rear base portion; and the surface layer portion is attached by four corner bolts provided one at each corner of the surface layer portion to the rear base portion, the surface layer portion is removed with respect to the rear base portion by loosening the corner bolts therefrom, and wherein the corner bolts are not exposed to the atmosphere within the treatment chamber when the gate valve is closed.

2. The treatment apparatus according to claim 1, wherein the surface layer portion has an O-ring arranged to isolate the four corner bolts from the treatment chamber atmosphere when the gate valve is closed.

3. A treatment apparatus comprising a gas-tight treatment chamber and a gate valve opening and closing a treatment object transport opening formed in the treatment chamber, wherein:

a treatment object is treated by a treatment gas or plasma thereof;

the gate valve includes a multi-layer construction having a surface layer portion and a rear base portion;

the surface layer portion has a surface and a sealing means on the surface;

when the gate valve is closed, the sealing means defines a region of the surface that is exposed to the atmosphere within the treatment chamber and a second region of the surface that is isolated from the atmosphere within the treatment chamber; and the surface layer portion is attached to the rear base portion by fasteners that pass through the second region of the surface to the rear base portion, whereby the fasteners are isolated from the atmosphere within the treatment chamber.

4. The treatment apparatus according to claim 3, wherein the sealing means includes an O-ring.

5. The treatment apparatus according to claim 4, wherein the fasteners are bolts.

* * * * *